United States Patent
Hook et al.

(10) Patent No.: US 9,009,638 B1
(45) Date of Patent: Apr. 14, 2015

(54) ESTIMATING TRANSISTOR CHARACTERISTICS AND TOLERANCES FOR COMPACT MODELING

(71) Applicant: International Business Machines Corporation, Armonk, NY (US)

(72) Inventors: Terence B. Hook, Jericho Center, VT (US); Jeffrey B. Johnson, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/143,281

(22) Filed: Dec. 30, 2013

(51) Int. Cl.
*G06F 9/455* (2006.01)
*G06F 17/50* (2006.01)

(52) U.S. Cl.
CPC .................................. *G06F 17/5072* (2013.01)

(58) Field of Classification Search
USPC ........................................................ 716/122
See application file for complete search history.

(56) References Cited

U.S. PATENT DOCUMENTS

| | | | |
|---|---|---|---|
| 7,302,376 B2 | 11/2007 | Adler et al. | |
| 8,271,256 B2 | 9/2012 | Khalily et al. | |
| 8,275,584 B2 | 9/2012 | Lin et al. | |
| 8,417,503 B2 | 4/2013 | Bernstein et al. | |
| 2009/0005894 A1* | 1/2009 | Bomholt et al. | 700/97 |
| 2011/0082680 A1 | 4/2011 | Chang et al. | |
| 2011/0191091 A1* | 8/2011 | Joshi et al. | 703/14 |
| 2013/0080984 A1* | 3/2013 | Liu et al. | 716/112 |

OTHER PUBLICATIONS

Y. Cao et al., "Mapping statistical process variations toward circuit performance variability: an analytical modeling approach," 42nd annual Design Automation Conference, 2005, pp. 658-663.
D. Boning et al., "Models of Process Variations in Device and Interconnect." in Design of High Performance Microprocessor Circuits, Chapter 6, 2000, pp. 98-116.
S. O'Uchi et al., "Characterization of metal-gate FinFET variability based on measurements and compact model analyses," IEEE International Electron Devices Meeting, IEDM, 2008, 4 pages.
S. O'Uchi et al., "Characterization of metal-gate FinFET variability based on measurements and compact model analyses," IEEE International Electron Devices Meeting, IEDM, 2008, Slide Presentation, 35 pages.

(Continued)

*Primary Examiner* — Paul Dinh
*Assistant Examiner* — Bryce Aisaka
(74) *Attorney, Agent, or Firm* — Anthony Canale; Roberts Mlotkowski Safran & Cole, P.C.

(57) ABSTRACT

Systems and methods for generating compact models that include the effects of physical and electrical variations independent of available hardware data. A method includes generating a physics-based model using a technology computer-aided design (TCAD) of the one or more devices in a technology node. The method further includes deriving electrical parameters for the one or more devices from the physics-based model. The method further includes generating the compact model based on the derived electrical parameters.

13 Claims, 6 Drawing Sheets

(56) References Cited

OTHER PUBLICATIONS

K. Takeuchi et al., "Statistical compact model parameter extraction by direct fitting to variations," IEEE Transactions on Electron Devices, vol. 55, No. 6, 2008, pp. 1487-1493.

X. Wang et al., "Statistical Threshold-Voltage Variability in Scaled Decananometer Bulk HKMG MOSFETs: A Full-Scale 3-D Simulation Scaling Study," IEEE Transactions on Electron Devices, vol. 58, No. 8, 2011, pp. 2293-2301.

Unknown, "Garand Statistical 3D TCAD Simulator", http://www.goldstandardsimulations.com/products/garand/, Gold Standard Simulations Ltd., 2013, pp. 1-2.

Unknown, "Mystic Statistical Compact Model Extractor", http://www.goldstandardsimulations.com/products/mystic/, Gold Standard Simulations Ltd., 2013, pp. 1-2.

Unknown, "RandomSpice Statistical Circuit Simulator", http://www.goldstandardsimulations.com/products/randomspice/, Gold Standard Simulations Ltd., 2013, 1 page.

* cited by examiner

| Cgd_fF | un_Idlin_uA | ui_Vtjlin_V | Vtjsat_V | Isoff_nA | ui_Ion_uA | un_Ieff_uA | un_Cgg_fF | Weff |
|---|---|---|---|---|---|---|---|---|
| 0.304 | 302.152 | 0.334 | 0.276 | 5.959 | 1235.37 | 661.385 | 1.153 | 60 |
| 0.304 | 318.47 | 0.334 | 0.276 | 5.992 | 1261.866 | 677.401 | 1.153 | 60 |
| 0.304 | 281.026 | 0.335 | 0.276 | 5.859 | 1198.461 | 638.98 | 1.153 | 60 |
| 0.292 | 301.572 | 0.334 | 0.276 | 5.959 | 1234.795 | 661.102 | 1.127 | 60 |
| 0.316 | 302.71 | 0.334 | 0.276 | 5.959 | 1235.924 | 661.658 | 1.178 | 60 |
| 0.304 | 301.123 | 0.335 | 0.278 | 5.645 | 1143.401 | 616.342 | 1.153 | 60 |
| 0.304 | 302.896 | 0.333 | 0.274 | 6.236 | 1320.724 | 702.377 | 1.153 | 60 |
| 0.304 | 257.941 | 0.335 | 0.276 | 5.959 | 1183.429 | 633.138 | 1.153 | 60 |
| 0.304 | 330.929 | 0.334 | 0.276 | 5.959 | 1263.887 | 676.844 | 1.153 | 60 |
| 0.301 | 295.744 | 0.353 | 0.295 | 3.141 | 1179.114 | 621.431 | 1.143 | 60 |
| 0.307 | 308.408 | 0.314 | 0.255 | 11.258 | 1291.928 | 702.633 | 1.163 | 60 |
| 0.296 | 302.439 | 0.334 | 0.276 | 5.958 | 1235.661 | 661.545 | 1.138 | 60 |
| 0.312 | 301.589 | 0.334 | 0.276 | 5.959 | 1234.773 | 661.059 | 1.169 | 60 |
| 0.303 | 302.148 | 0.334 | 0.276 | 5.957 | 1235.357 | 661.379 | 1.15 | 60 |
| 0.305 | 302.15 | 0.334 | 0.276 | 5.959 | 1235.365 | 661.382 | 1.155 | 60 |
| 0.299 | 302.726 | 0.337 | 0.288 | 2.746 | 1260.407 | 670.777 | 1.156 | 59 |
| 0.308 | 312.828 | 0.332 | 0.263 | 12.68 | 1271.366 | 678.372 | 1.189 | 61 |
| 0.34 | 341.464 | 0.325 | 0.273 | 6.84 | 1226.047 | 657.48 | 1.301 | 70 |
| 0.268 | 258.803 | 0.345 | 0.28 | 4.784 | 1237.701 | 661.426 | 1.007 | 50 |
| 0.303 | 298.722 | 0.341 | 0.283 | 4.756 | 1218.321 | 648.273 | 1.152 | 60 |
| 0.305 | 305.514 | 0.327 | 0.269 | 7.47 | 1252.348 | 674.59 | 1.153 | 60 |
| 0.305 | 306.403 | 0.34 | 0.284 | 4.735 | 1213.375 | 646.194 | 1.151 | 60 |
| 0.304 | 302.479 | 0.331 | 0.268 | 8.08 | 1225.281 | 660.314 | 1.183 | 60 |
| 0.287 | 290.529 | 0.344 | 0.294 | 2.6 | 1169.726 | 621.065 | 1.148 | 60 |
| 0.325 | 318.247 | 0.325 | 0.252 | 16.918 | 1270.747 | 687.419 | 1.184 | 60 |
| 0.301 | 290.208 | 0.337 | 0.273 | 7.903 | 1168.176 | 626.406 | 1.109 | 60 |
| 0.307 | 317.628 | 0.332 | 0.279 | 4.499 | 1320.031 | 704.491 | 1.245 | 60 |
| 0.314 | 304.379 | 0.334 | 0.276 | 5.99 | 1237.768 | 662.693 | 1.172 | 60 |
| 0.296 | 295.537 | 0.334 | 0.276 | 5.925 | 1228.172 | 657.452 | 1.138 | 60 |
| 0.299 | 304.381 | 0.334 | 0.273 | 7.274 | 1246.03 | 665.067 | 1.124 | 60 |
| 0.309 | 303.54 | 0.334 | 0.278 | 5.212 | 1239.549 | 663.485 | 1.171 | 60 |
| 0.305 | 292.037 | 0.348 | 0.305 | 1.415 | 1151.964 | 609.592 | 1.27 | 60 |
| 0.304 | 323.123 | 0.316 | 0.232 | 41.761 | 1312.067 | 715.313 | 1.065 | 60 |

FIG. 4

| variable | Cgs | Cgg | vfm | vtsat | Idlin | Ion | Ieff |
|---|---|---|---|---|---|---|---|
| dfm | 0.2656 aF/nm/nm | 9.74E-01 aF/nm/nm | -2.50E+00 mV /nm | -1.25E+01 mV /nm | 3.42E+00 percent/nm | 2.14E+00 percent/nm | 2.28E+00 percent/nm |

ESTIMATING TRANSISTOR CHARACTERISTICS AND TOLERANCES FOR COMPACT MODELING

FIELD OF THE INVENTION

The invention relates to systems and methods for integrated circuit ("IC") modeling and, more particularly, to systems and methods for generating compact models that include the effects of physical and electrical variations independent of available hardware data.

BACKGROUND

Compact modeling pertains to the development of models for integrated semiconductor devices for use in circuit simulations. The models are used to reproduce device terminal behaviors with accuracy, computational efficiency, and relative model simplicity for a circuit or system-level simulation, for future technology nodes. The users of the models are typically the IC designers. The industry's dependence on accurate and time-efficient compact models continues to grow as circuit operating frequencies increase and device tolerances scale down with associated increases in chip device count, and analog content in mixed-signal circuits. Compact modeling is an important step in the design cycle of modern IC products. More specifically, it is an important step for information transfer from technology development and fabrication to circuit and product design.

Circuit simulations are used in integrated circuit design to predict how a circuit behaves prior to the circuit being physically implemented, e.g., fabricated. Circuit simulators, such as Simulation Program with Integrated Circuit Emphasis (SPICE), rely on mathematical compact models of circuit elements to perform such simulations. The compact models are typically expressed as a set of equations and a set of parameters for the equations that predict the current and charges at terminals of a semiconductor device as a function of the voltages at the terminals. The compact models are fit to characteristics of a particular process in which some of the characteristics are represented by sample devices and some of the characteristics are different from available hardware. Such compact models are typically built while the process is still under development, and historical information from previous generations is often used to inform the characteristics of the model of the new, and empirically untested, generation. Such methods of extrapolation have limitations, however, such as when there are major modifications in transistor architecture (such as from bulk planar to FinFET or nanowire), or materials (such as from silicon to InGaAs), or for widely disparate characteristics such as dielectric thickness, threshold voltage, and physical dimensions. Alternatively, and preferably, utilization of physics-based models to inform the parameters of the compact model can circumvent these issues.

SUMMARY

In a first aspect of the invention, a method is provided for generating a compact model for one or more devices. The method includes generating a physics-based model using a technology computer-aided design (TCAD) of the one or more devices in a technology node. The method further includes deriving electrical parameters for the one or more devices from the physics-based model. The method further includes generating the compact model based on the derived electrical parameters. At least the step of generating the compact model is performed using at least one processor.

In another aspect of the invention, a system is provided for generating a compact model for one or more devices. The system includes a computer device including a processor configured to execute at least one application operable to: generate a physics-based model using a technology computer-aided design (TCAD) of the one or more devices in a technology node; generate a set of TCAD models of the one or more devices by varying process variables of the physics-based model; derive electrical parameters for the one or more devices from each TCAD model of the set of TCAD models; and generate the compact model for the one or more devices based on the derived electrical parameters.

In yet another aspect of the invention, a computer program product is provided for that includes a computer readable storage medium having readable program code embodied in the storage medium. The computer program product includes at least one component operable to: generate a physics-based model using a technology computer-aided design TCAD of the one or more devices in a technology node; generate a nominal compact model of the one or more devices based on the physic-based model; generate a set of TCAD models of the one or more devices by varying process variables of the physics-based model; deriving electrical parameters for the one or more devices from each TCAD model of the set of TCAD models; calculate variation in device variables for the variation of the process variables to establish electrical tolerances for the one or more devices; and incorporate the electrical tolerances established for the one or more devices into the nominal compact model to generate a new compact model.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to systems and methods for integrated circuit ("IC") modeling and, more particularly, to systems and methods for generating compact models that include the effects of physical and electrical variations independent of available hardware data. More specifically, implementations of the invention provide systems and methods for generating compact transistor models, including tolerances, that are capable of calculating device characteristics in detail at arbitrary operating conditions and also include physical variation when complete hardware data is unavailable during early stages of the development cycle.

In embodiments, technology computer aided design (TCAD) can be used to generate compact transistor models as well as supply variability information for inclusion in the compact transistor models. Once the structure has been defined and the nominal characteristics created for the incorporation into the compact transistor models, the structural and electrical components (e.g., process variables) of the transistors can be varied and the transistor sensitivities extracted. Projections of how well the process variables can be controlled, typically defined by the standard deviation (e.g., sigma) of their statistical variation, may be applied to the extracted sensitivities to define corner models (e.g., the fastest and slowest cases of the transistor). The transistor model parameters themselves (e.g., threshold voltage, series resistance, etc.) may have a statistical distribution defined by the combination of the TCAD transistor sensitivities and process variable sigmas. These can become part of the compact transistor model when run in statistical (e.g., Monte Carlo) mode.

Advantageously, in embodiments, the systems and methods of the present invention allow for the multiplicity of devices (e.g., transistors of various sorts, such as high-threshold and low-threshold, thick-oxide and thin-oxide, short-channel, and long-channel, etc.) to be treated entirely analogously such that device behavior and tolerances are internally self-consistent and physics-based. Also advantageously, in embodiments, the systems and methods of the present invention provide for accurate and computationally efficient compact transistor models that may be used to simulate circuits in a variety of metal-oxide-semiconductor field-effect transistor (MOSFET) technologies.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 1:
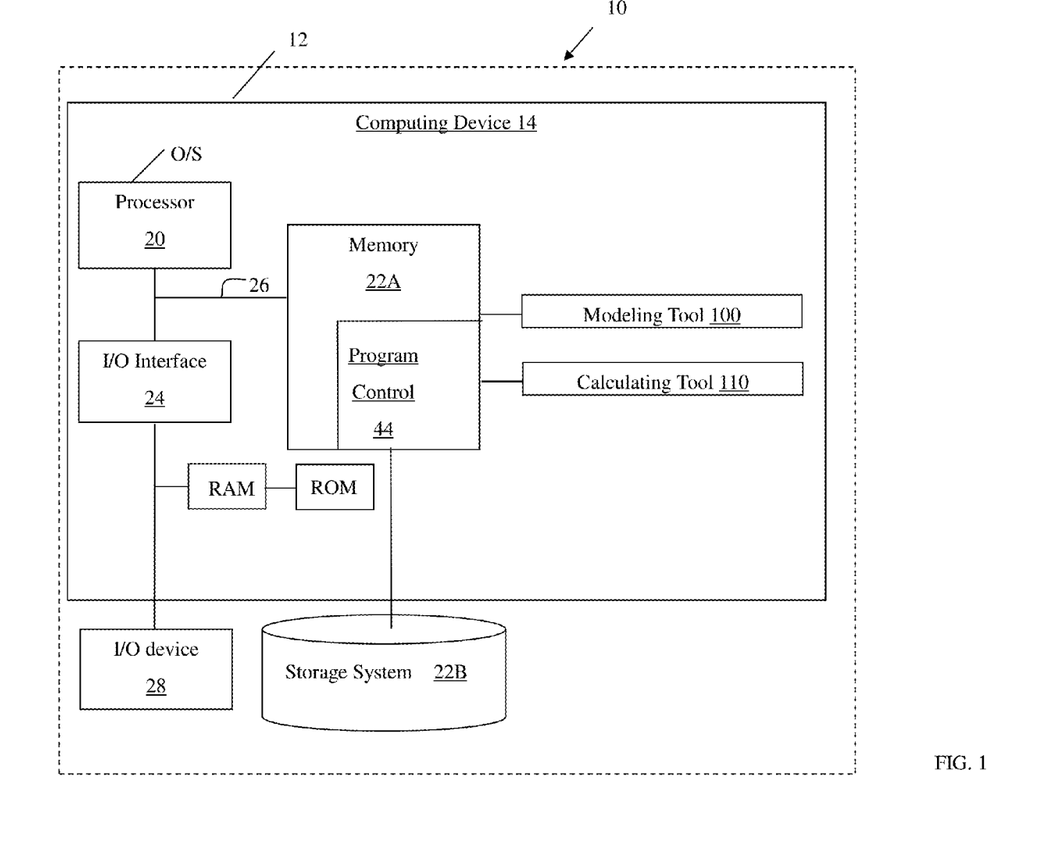
FIG. 1 shows an illustrative environment for implementing the steps in accordance with aspects of the invention.

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

In general, the processor 20 executes computer program code (e.g., program control 44), which can be stored in the memory 22A and/or storage system 22B. Moreover, in accordance with aspects of the invention, the program control 44 controls at least: (1) a modeling tool 100 that performs one or more of the processes described herein, e.g., generating compact models that are capable of calculating device characteristics in detail at arbitrary operating conditions; and (2) a calculating tool 110 that performs one or more processes described herein, e.g., calculating key transistor parameters. The modeling tool 100 and the calculating tool 110 can be implemented as one or more program code in the program control 44 stored in memory 22A as separate or combined modules. Additionally, the modeling tool 100 and the calculating tool 110 may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention. The bus 26 provides a communications link between each of the components in the computing device 14.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
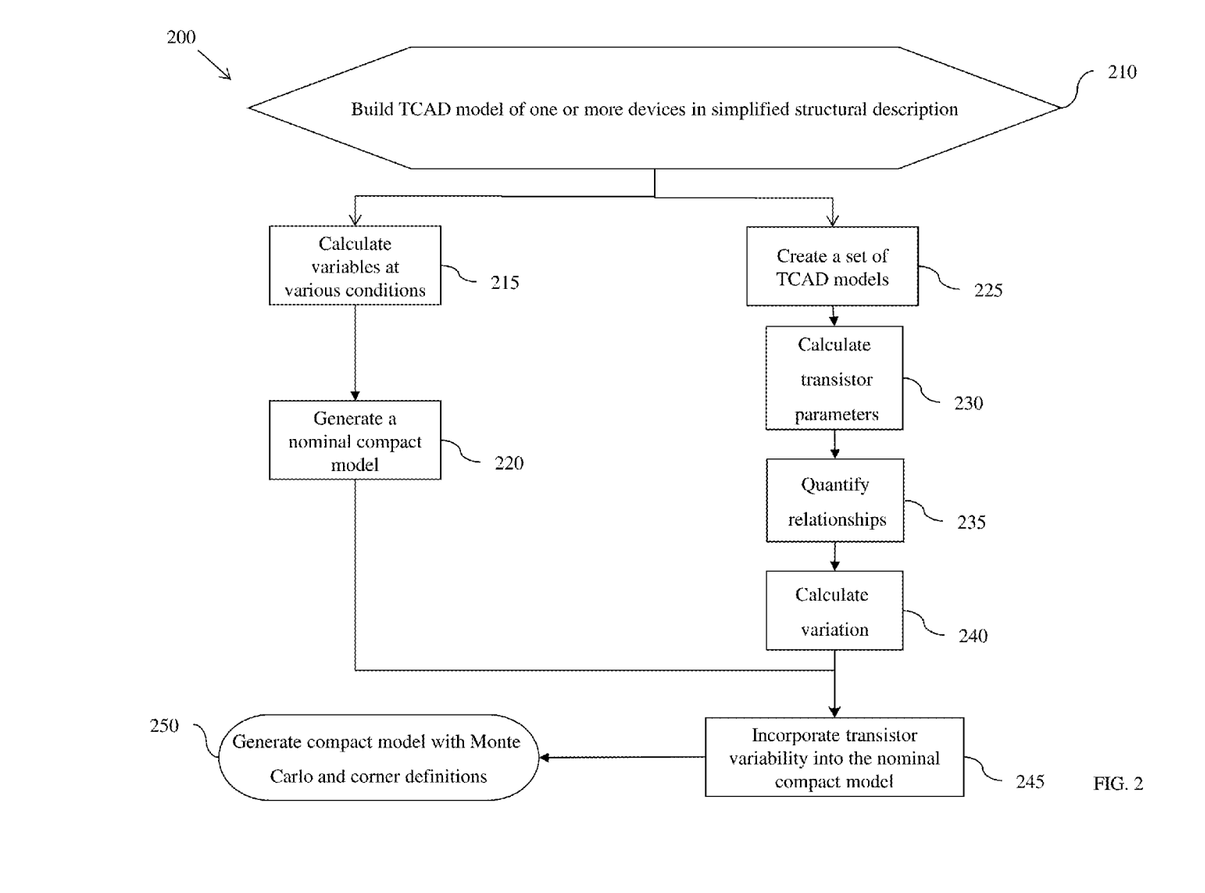
FIG. 2 is an illustrative process flow for implementing the system in accordance with aspects of the invention.

FIG. 2 shows an exemplary flow for performing aspects of the present invention. The steps of FIG. 2 may be implemented in the environment of FIG. 1, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As shown in FIG. 2, a process 200 is provided for in which physics-based and internally self-consistent electrical technology parameters are established for targeting and ultimately compact model generation. At step 210, a simplified TCAD model of one or more devices (e.g., at least one transistor) in a technology node are generated in a simplified structural description (e.g., Synopsis SDE). In embodiments, the generated TCAD model may comprise physical characteristics (e.g., transistor dimensions) of the one or more devices, calibrated doping profiles of the one or more devices, material properties (e.g., dielectric constant and band structure) of the one or more devices, and calibrated equations for carrier transport of the one or more devices. A TCAD tool, such as the modeling tool 100 described with respect to FIG. 1, may be used to generate the current-voltage and capacitance-voltage information needed for the creation of a nominal compact model (the left-hand side of the flow chart in FIG. 2).

At step 215, nominal capacitance and voltage, and independent variables for the one or more devices are calculated at various environmental conditions. For example, a TCAD tool, such as the modeling tool 100 as described with respect to FIG. 1, may be used to calculate the nominal capacitance and voltage, and independent variables for the one or more devices at various conditions (e.g., at various temperatures and voltages) based on the simplified TCAD model of the one or more device. In embodiments, once the structure of the one or more devices has been defined at step 210, the nominal capacitance and voltage, and the independent variables are calculated at step 215 for incorporation into the simplified TCAD model to generate a nominal compact model at step 220.

At step 225, a set of TCAD models of the one or more devices (e.g., the at least one transistor) in the technology node may be generated by varying process variables (i.e., a perturbation). In embodiments, the process variables that may be varied to generate the set of TCAD models may include physical dimensions, material properties, and transport variables such as mobility and saturation velocity. For example, a TCAD tool, such as the modeling tool 100 described with respect to FIG. 1 may be used to generate the set of TCAD compact models (the right-hand side of the flow chart in FIG. 2) based on a systematic perturbation of inputs for the physics-based simplified TCAD model of the one or more devices.

Figure 3:
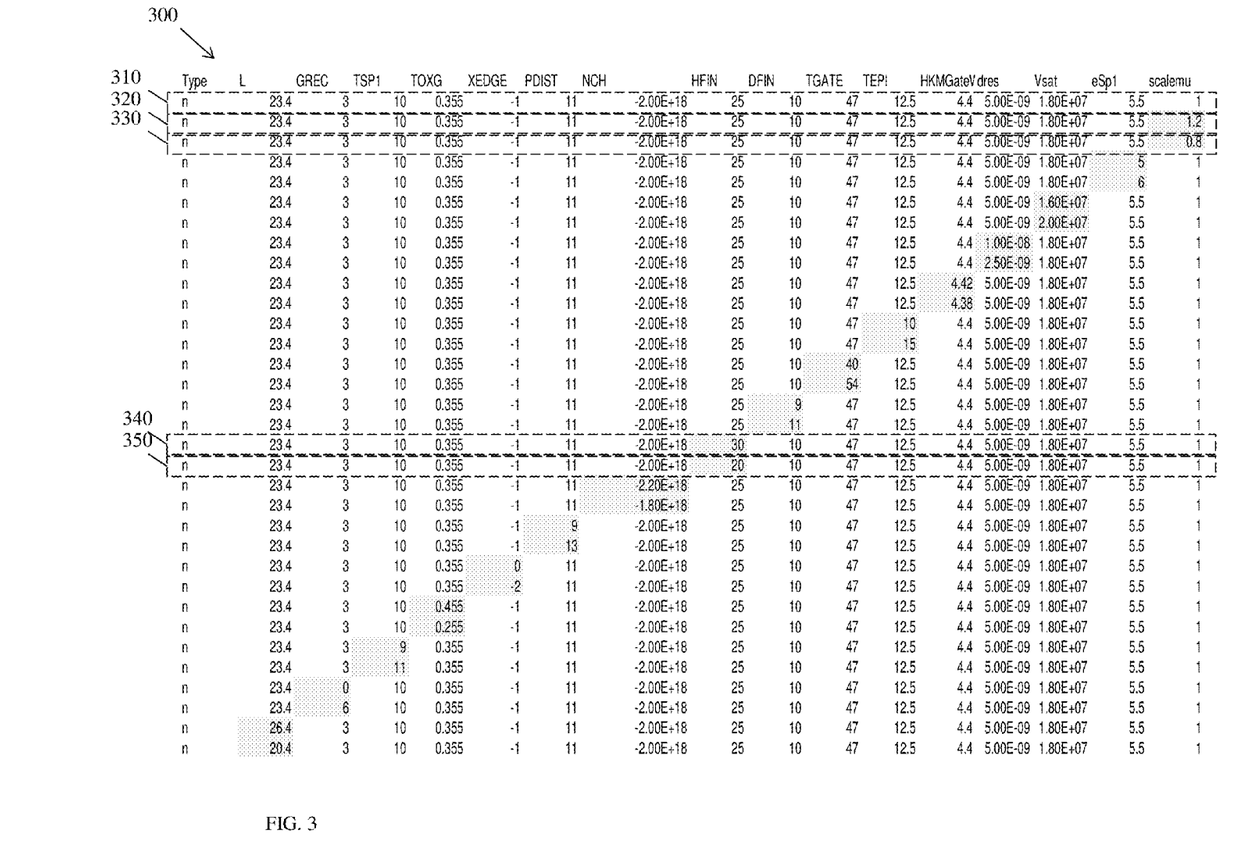
FIGS. 3 and 4 show examples of process variables and device parameters generated respectively in accordance with aspects of the invention.

In accordance with these aspects of the invention, a plurality of TCAD models may be generated for the one or more devices by varying process variables. For example as shown in FIG. 3, a matrix of variations 300 may be generated using a calculation tool, such as the calculating tool 110 described with respect to FIG. 1. The matrix of variations 300 may include a first entry 310 for the nominal compact model that includes the nominal values for the process variables (e.g., parameter values such as nominal transistor dimensions, material properties, and carrier transport variables, as described with respect to step 210). Each entry thereafter in the matrix of variations 300 may also include the nominal values for the process variables with at least one parameter changed, preferably only one parameter changed. For example, in a second entry 320 of the matrix of variations 300, the long channel mobility (e.g., scalemu) of the nominal TCAD model may be varied by a first predetermined percentage (e.g., varied up by 20% as shown in the shaded portion). In a third entry 330 of the matrix of variations 300, the long channel mobility of the nominal TCAD model may be varied by a second predetermined percentage (e.g., varied down by 20% as shown in the shaded portion). As such, a different TCAD model may be generated for each of the entries using the nominal values for the process variables and the at least one process variable that is varied or changed to systematically generate a set of TCAD models.

Accordingly, it should be understood by those of ordinary skill in the art that the matrix of variations 300 provides a linearized variation of a single parameter at a time such that it is possible in later steps to determine how each parameter change affects the behavior of the one or more devices. In embodiments, the variation or change applied to the single parameter may be constrained similar to final tolerances for the one or more devices to which processes are driven towards. In other words, the range of the variation or change applied to the single parameter may be constrained reasonably similar to that which the processes of the one or more devices may deliver.

At step 230, device parameters may be calculated for the perturbations of each of the plurality of TCAD models generated in step 225. In embodiments, the device parameters (e.g., transistor parameters) may be identified as key device parameters that an IC designer is interested in monitoring during the design of the one or more devices. For example, the key device parameters may comprise electrical parameters such as threshold voltage (Vt), the saturated on-current (Ion), the off-current (Ioff, the effective switching current (Ieff), the gate-source capacitance (Cgs), and the gate-channel capacitance (Cgon). In embodiments, the device parameters may be calculated as a function of various conditions (e.g., at various voltages and temperatures) for each of the one or more devices.

Figure 4:
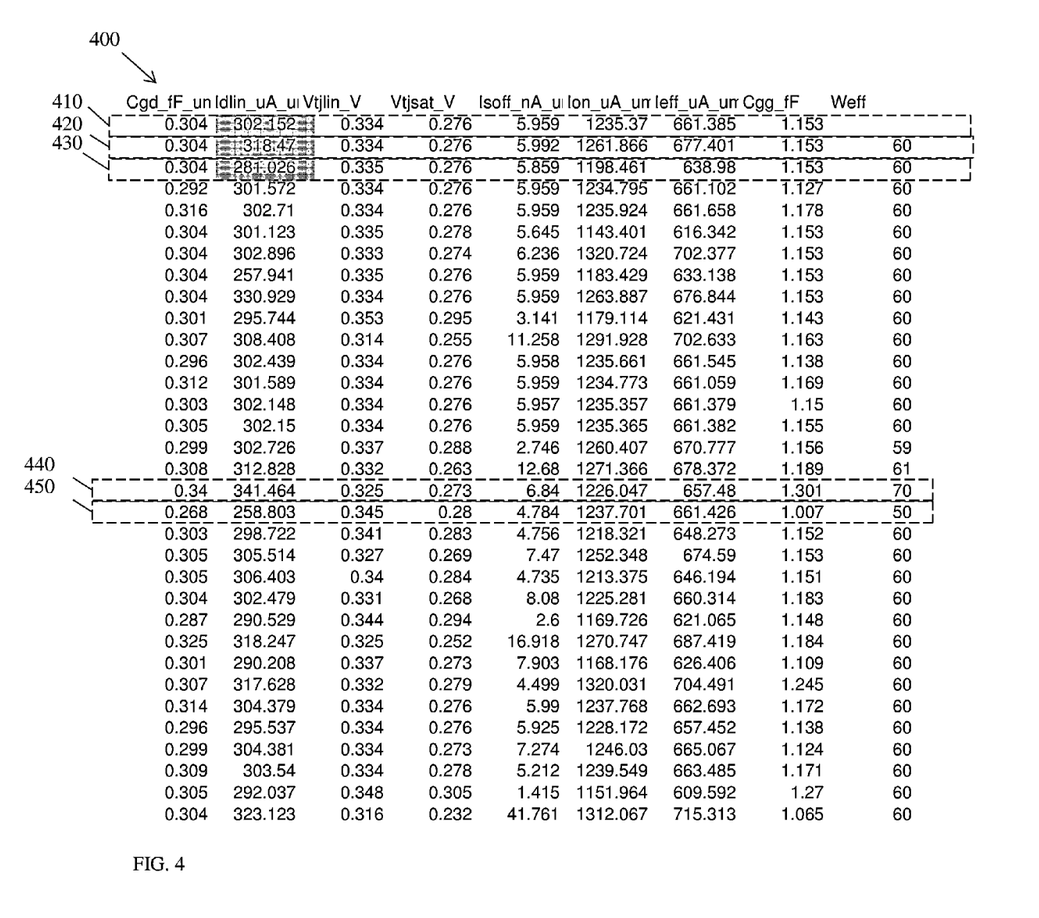

In accordance with these aspects of the invention, a plurality of key device parameters may be calculated for perturbations of the process variables identified in the matrix of variations 300 discussed with respect to FIG. 3. For example, as shown in FIG. 4, a matrix of outputs 400 may be generated using the TCAD tool, such as the modeling tool 100 described with respect to FIG. 1. The matrix of outputs 400 may include a first entry 410 for the nominal compact model that includes the nominal output values for identified key device parameters based on the nominal values for the process variables. Each entry thereafter in the matrix of outputs 400 may include output values for the identified key device parameters based on the nominal values for the process variables and the at least one parameter changed. For example, in a second entry 420 of the matrix of outputs 400, the long channel mobility was varied up by 20%, and correspondingly this variation caused the key device parameter idlength (shown in the shaded portion) to increase. In a third entry 430 of the matrix of outputs 400, the long channel mobility was varied down by 20%, and correspondingly this variation caused the key parameter idlin (drain current in the linear operating mode) (shown in the shaded portion) to decrease. As such, the affect of varying the process variables in the matrix of variations 300 is not known a priori, but are clearly comprehensible a posteriori from the matrix of outputs 400.

At step 235, relationships between the process variables and the device parameters may be quantified. In embodiments, the relationships between the process variables used to calculate each of the TCAD models generated for the one or more devices in step 225 and the device parameters calculated for perturbations of each of the TCAD models in step 230 are quantified. For example, the relationships between the two sets of data may be quantified via equation, table, or response surface expression.

Figure 5:
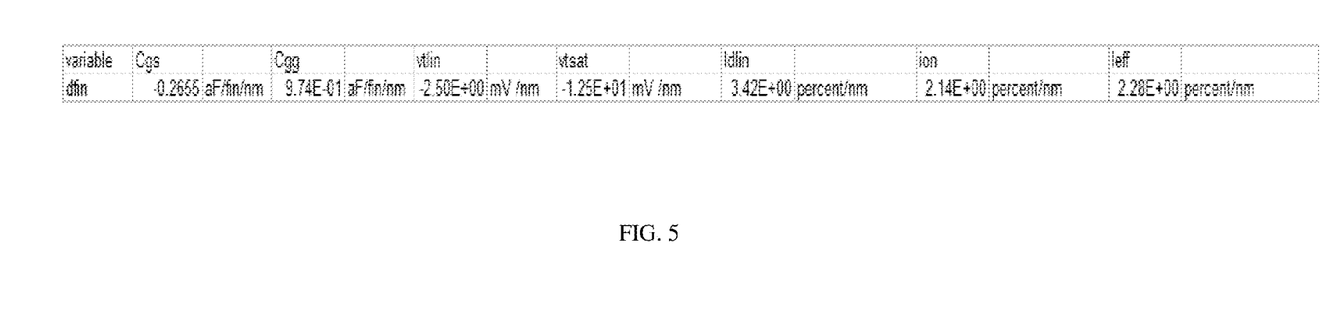
FIG. 5 shows an example of a linearized dependence of electrical parameters as a function of one physical parameter (e.g., fin height) in accordance with aspects of the invention.

As an example shown in FIG. 5, the influence of the change in the fin height (HFIN data presented in entries 340 and 350 shown in FIG. 3), as reflected in some of the key parameters (parameter entries 440 and 450 shown in FIG. 4), may be calculated in terms of change of capacitance in aF per nm of change, or change of current in units of percent per nm. While these examples are linearized, a more complex function may be utilized to describe the variation if warranted or desired, as should be understood by those of ordinary skill in the art. As should also be understood, all major aspects of the transistor response to changing fin height may be inherently included, for example, the larger perimeter of conducting surface, the subtle change in electrostatics associated with the aspect ratio change, the increased extrinsic resistance associated with the longer current path at the source and the drain, etc.

At step 240, variation in device variables for the specified variation (i.e., perturbations) of the process variables may be calculated based on manufacturing capability. In embodiments, the specified variation of the process variables in step 225 and the quantified relationships between the process variables and the device parameters may be used to calculate a net variation of variables (e.g., current, capacitances, and threshold voltage) for the one or more devices based on manufacturing capability. For example, the threshold voltage variation may be dependent on the manufacturing capability of physical dimensions, such as channel length and fin width, and also work function variation. The calculated variation in device variables establishes electrical tolerances for each of the one or more devices. Accordingly, as should be understood by those of ordinary skill in the art, the systematic perturbation of the physical and electrical inputs for the nominal compact model establish the electrical tolerances for each of the one or more devices.

At step 245, the variation in the device variables may be incorporated into the nominal compact model generated in step 220. In embodiments, the variation in the device variables may be incorporated into the nominal compact model as part of a Monte Carlo (MC) capability by suitably modifying the variation of the compact model parameters until the compact model variation matches the variation as derived through the TCAD analysis. For example, the incorporation of the variation into the nominal compact model may comprise fitting the nominal compact model to the calculated device parameters (e.g., currents and capacitances) and matching the nominal compact model tolerances to the established electrical tolerances.

At step 250, a compact model with MC and corner definitions may be generated by incorporating all the known and defined variations as identified above, by defining a set of parameters as representing the 'worst' and the 'best' cases, as is typical for corner definition with respect to the underlying Monte Carlo distributions of parameters. Advantageously, this same process may be applied uniformly and simultaneously to two or more device in the same technology offering.

Figure 6:
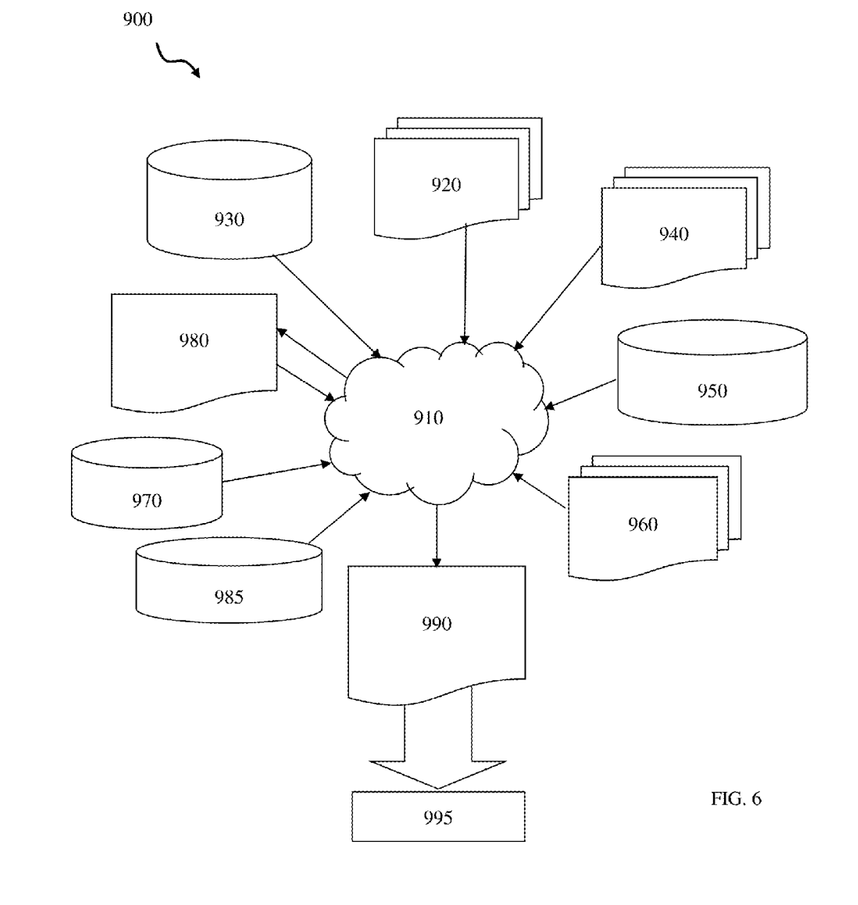
FIG. 6 is a flow diagram of a design process used in semiconductor design, manufacture, and/or test.

FIG. 6 is a flow diagram of a design process used in semiconductor design, manufacture, and/or test used with the system and method of the present invention. FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system, which can be implemented with the method and system of the present invention. As such, design structure 920 may comprise files or other data structures including human and/or machine-readable source code, compiled structures, and computer-executable code structures that when processed by a design or simulation data processing system functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 that may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more devices. In one embodiment, design structure 990 may comprise a compiled, executable HDL simulation model that functionally simulates the devices.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of generating a compact model for one or more devices, comprising:
   generating a physics-based model using a technology computer-aided design (TCAD) of the one or more devices in a technology node;
   calculating nominal capacitance and voltage, and independent variables for the one or more devices based on the physics-based model;
   incorporating the calculated nominal capacitance and voltage, and the independent variables into the physics-based model to generate a nominal compact model;
   generating a matrix of variations comprising a set of TCAD models of the one or more devices by varying process variables, wherein the matrix of variations includes:
      a first entry for the nominal compact model that includes nominal values for the process variables for the nominal compact model; and
      a plurality of additional entries, wherein each entry of the plurality of additional entries includes at least one change in the nominal values for the process variables;
   generating a matrix of outputs comprising key device parameters that an integrated circuit designer is interested in monitoring, wherein the matrix of outputs includes:
      a first entry for the nominal compact model that includes nominal output values for the key device parameters based on the nominal values for the process variables found in the first entry of the matrix of variations; and
      a plurality of additional entries, wherein each entry of the plurality of additional entries includes output values for the key device parameters based on the at least one change in the nominal values for the process variables found in the plurality of additional entries of the matrix of variations;
   quantifying relationships between the process variables in the matrix of variations and the key device parameters in the matrix of outputs in terms of change of capacitance or current;
   calculating a net variation of variables for the one or more devices using the at least one change in the nominal values for the process variables found in the plurality of additional entries of the matrix of variations and the quantified relationships between the process variables and the key device parameters; and
   generating the compact model based at least on the net variation of variables,
   wherein at least the step of the generating the compact model is performed using at least one processor.

2. The method of claim 1, wherein:
   the matrix of variation is a systematic perturbation of inputs for the physics-based model;
   the key device parameters include electrical parameters;
   the electrical parameters comprise currents and capacitances;
   the generating the matrix of outputs comprises calculating the currents and capacitances as a function of voltages and temperatures; and
   the generating the compact model comprises fitting the compact model to the calculated currents and capacitances.

3. The method of claim 2, further comprising calculating variation in the currents and capacitances to establish electrical tolerances for each of the one or more devices, wherein the electrical tolerances are established by the systematic perturbation of inputs for the physics-based model and the electrical parameters.

4. The method of claim 3, wherein:
   the electrical parameters are calculated as a function of the systematic perturbations of the inputs for the physics-based model; and
   the established electrical tolerances are matched to tolerances of the generated compact model.

5. The method of claim 1, wherein the steps of claim 1 are applied uniformly and simultaneously to two or more devices in the same technology node.

6. The method of claim 1, wherein the physics-based model is a simplified TCAD model.

7. The method of claim 1, wherein the calculated nominal capacitance and voltage, and the independent variables are calculated at various temperatures and voltages.

8. The method of claim 1, wherein the process variables comprise at least one of physical dimensions, material properties, and transport variables.

9. The method of claim 1, wherein:
the calculated nominal capacitance and voltage, and the independent variables are calculated at various temperatures and voltages;
the matrix of variation is a systematic perturbation of inputs for the physics-based model;
the key device parameters include electrical parameters; and
the at least one change in the nominal values for the process variables comprises at least one linearized variation of each parameter of the physics-based model.

10. The method of claim 9, wherein the generating the matrix of outputs comprises calculating the electrical parameters as a function of the various temperatures and voltages.

11. The method of claim 1, further comprising incorporating the net variation of variables for the one or more devices into the nominal compact model.

12. A system for generating a compact model for one or more devices, comprising:
a computer device comprising a processor configured to execute at least one application operable to:
generate a physics-based model using a technology computer-aided design (TCAD) of the one or more devices in a technology node;
calculate nominal capacitance and voltage, and independent variables for the one or more devices based on the physics-based model;
incorporate the calculated nominal capacitance and voltage, and the independent variables into the physics-based model to generate a nominal compact model;
generate a matrix of variations comprising a set of TCAD models of the one or more devices by varying process variables of the physics-based model, wherein the matrix of variations includes:
a first entry for the nominal compact model that includes nominal values for the process variables for the nominal compact model; and
a plurality of additional entries, wherein each entry of the plurality of additional entries includes at least one change in the nominal values for the process variables;
generate a matrix comprising key device parameters that an integrated circuit designer is interested in monitoring, wherein the matrix of outputs includes:
a first entry for the nominal compact model that includes nominal output values for the key device parameters based on the nominal values for the process variables found in the first entry of the matrix of variations; and
a plurality of additional entries, wherein each entry of the plurality of additional entries includes output values for the key device parameters based on the at least one change in the nominal values for the process variables found in the plurality of additional entries of the matrix of variations;
quantify relationships between the process variables in the matrix of variations and the key device parameters in the matrix of outputs in terms of change of capacitance or current;

calculate a net variation of variables for the one or more devices using the at least one change in the nominal values for the process variables found in the plurality of additional entries of the matrix of variations and the quantified relationships between the process variables and the key device parameters; and
generate the compact model for the one or more devices based at least on the net variation of variables.

13. A computer program product comprising a computer readable storage medium having readable program code embodied in the storage medium, the computer program product includes at least one component operable to:
generate a physics-based model using a technology computer-aided design (TCAD) of the one or more devices in a technology node;
calculate nominal capacitance and voltage, and independent variables for the one or more devices based on the physics-based model;
generate a nominal compact model of the one or more devices by incorporating the calculated nominal capacitance and voltage, and the independent variables into the physics-based model;
generate a matrix of variations comprising a set of TCAD models of the one or more devices by varying process variables of the physics-based model, wherein the matrix of variations includes:
a first entry for the nominal compact model that includes nominal values for the process variables for the nominal compact model; and
a plurality of additional entries, wherein each entry of the plurality of additional entries includes at least one change in the nominal values for the process variables;
generate a matrix of outputs comprising key device parameters that an integrated circuit designer is interested in monitoring, wherein the matrix of outputs includes:
a first entry for the nominal compact model that includes nominal output values for the key device parameters based on the nominal values for the process variables found in the first entry of the matrix of variations; and
a plurality of additional entries, wherein each entry of the plurality of additional entries includes output values for the key device parameters based on the at least one change in the nominal values for the process variables found in the plurality of additional entries of the matrix of variations;
quantify relationships between the process variables in the matrix of variations and the key device parameters in the matrix of outputs in terms of change of capacitance or current;
calculate a net variation of variables for the one or more devices using the at least one change in the nominal values for the process variables found in the plurality of additional entries of the matrix of variations and the quantified relationships between the process variables and the key device parameters; and
incorporate the net variation of variables for the one or more devices into the nominal compact model to generate a new compact model.

* * * * *